(12) United States Patent
Kaviani

(10) Patent No.: US 6,756,822 B1
(45) Date of Patent: Jun. 29, 2004

(54) PHASE DETECTOR EMPLOYING ASYNCHRONOUS LEVEL-MODE SEQUENTIAL CIRCUITRY

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/285,037

(22) Filed: Oct. 31, 2002

(51) Int. Cl.[7] ................................................. H03K 9/00
(52) U.S. Cl. ............................................. 327/3; 327/12
(58) Field of Search ................................ 327/1, 2, 7, 8, 327/12

(56) References Cited

U.S. PATENT DOCUMENTS

| | | | |
|---|---|---|---|
| 4,378,509 A | 3/1983 | Hatchett et al. | 327/5 |
| 4,970,475 A | 11/1990 | Gillig | 331/25 |
| 5,686,846 A | * 11/1997 | Holcomb et al. | 327/37 |
| 5,744,983 A | * 4/1998 | Bazes | 327/3 |
| 6,191,613 B1 | 2/2001 | Schultz et al. | 326/39 |
| 6,198,317 B1 | * 3/2001 | Chow et al. | 327/116 |
| 6,204,710 B1 | 3/2001 | Goetting et al. | 327/276 |
| 6,289,068 B1 | 9/2001 | Hassoun et al. | 375/376 |
| 6,384,647 B1 | 5/2002 | Logue | 327/153 |
| 6,400,734 B1 | 6/2002 | Weigand | 370/514 |
| 6,480,047 B2 | * 11/2002 | Abdel-Maguid et al. | 327/161 |

FOREIGN PATENT DOCUMENTS

JP 09121155 A * 5/1997

* cited by examiner

*Primary Examiner*—Dinh T. Le
(74) *Attorney, Agent, or Firm*—W. Eric Webostad; Edel M. Young; Justin Liu

(57) ABSTRACT

A phase detector employing asynchronous level-mode sequential circuitry is described. The phase detector includes edge detection circuitry for generating a first edge detection signal and a second edge detection signal. The first edge detection signal is indicative of an edge in a first clock signal, and the second edge detection signal is indicative of an edge in a second clock signal. The phase detector further includes a state machine that is asynchronously responsive to level changes in the first and second edge signals. The state machine generates a control signal indicative of which of the first and second clock signals is leading the other of the first and second clock signals.

15 Claims, 10 Drawing Sheets

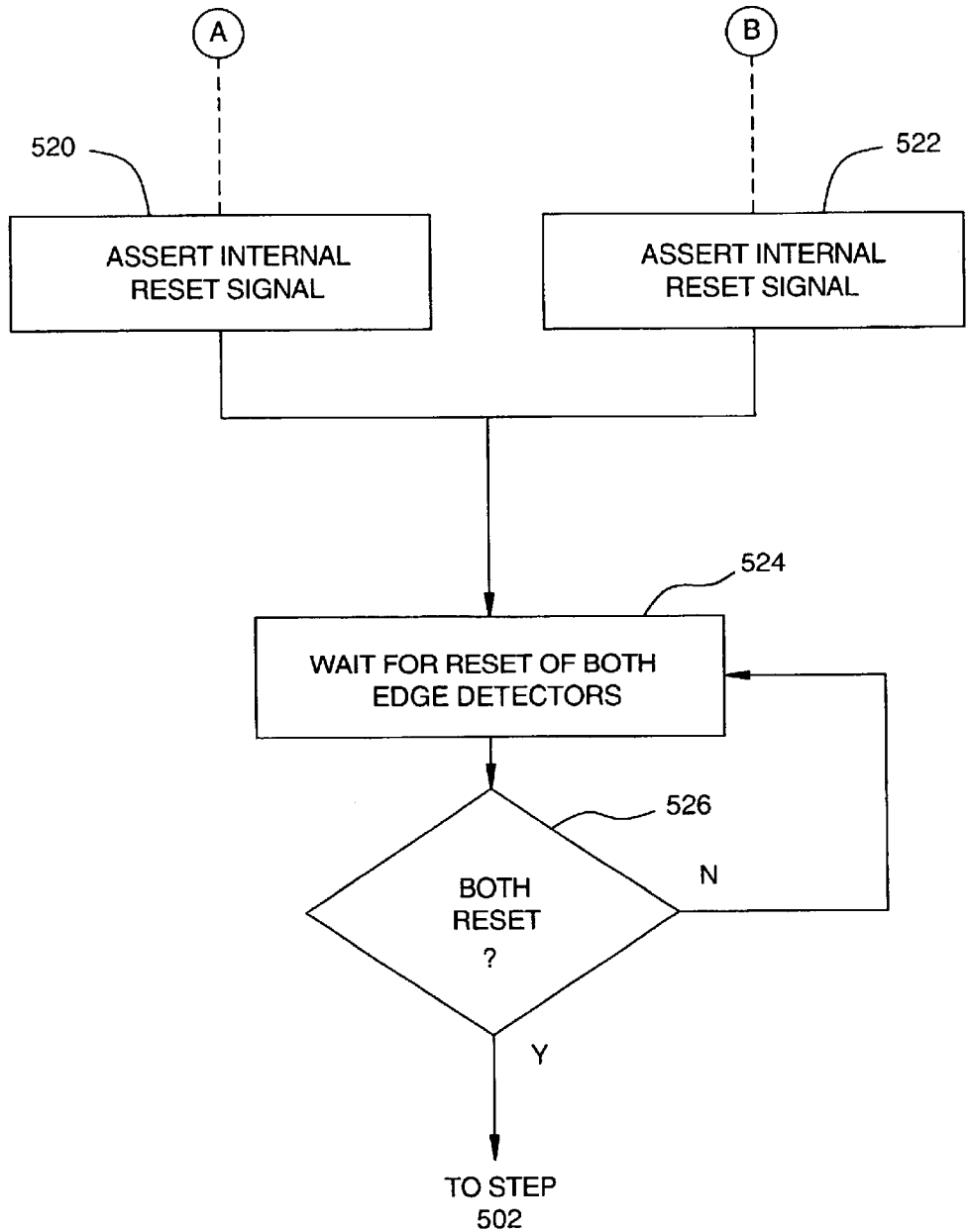
FIG. 5B
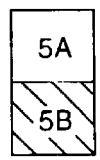

PHASE DETECTOR EMPLOYING ASYNCHRONOUS LEVEL-MODE SEQUENTIAL CIRCUITRY

FIELD OF THE INVENTION

One or more aspects of the present invention relate generally to clock management circuits for digital systems and, more particularly, to phase detection using asynchronous level-mode sequential circuitry.

BACKGROUND OF THE INVENTION

Clock management circuits are used in integrated circuit (IC) devices, such as field programmable gate arrays (FPGAs), to control timing of various clock signals therein. For example, clock management circuits can be used to compensate for skewing in a clock signal as the clock signal propagates within or between IC devices. Clock skew is caused by various factors, such as capacitive and resistive loading on the clock line, and propagation delay.

Clock management is often performed using phase-lock loop (PLL) or delay-lock loop (DLL) circuits. In general, PLL and DLL circuits are used to synchronize the frequency and/or phase of an output clock signal to that of an input clock signal. PLL and DLL circuits employ phase detectors to determine how much and in what direction the frequency and/or phase of the output clock signal should be adjusted relative to the input clock signal. In fully-digital clock management systems, it is desirable for the phase detector to remain stable in between phase detection operations.

Known phase detectors, however, are deleteriously affected by undesired jitter in the clock signals. Such jitter is typically caused by local noise within the clock management circuit, as well as external noise within the IC device. Phase detectors are also susceptible to mismatch among their various constituent components.

Accordingly, it would be both desirable and useful to provide an improved phase detector for use with clock management circuits in IC devices.

SUMMARY OF THE INVENTION

A phase detector employing asynchronous level-mode sequential circuitry is provided in accordance with one or more aspects of the present invention. The phase detector comprises edge detection circuitry for generating a first edge detection signal and a second edge detection signal. The first edge detection signal is indicative of an edge in a first clock signal, and the second edge detection signal is indicative of an edge in a second clock signal. The phase detector further includes a state machine that is asynchronously responsive to level changes in the first and second edge signals. The state machine generates a control signal indicative of which of the first and second clock signals is leading the other of the first and second clock signals.

BRIEF DESCRIPTION OF THE DRAWINGS

Accompanying drawing(s) show exemplary embodiment (s) in accordance with one or more aspects of the invention; however, the accompanying drawing(s) should not be taken to limit the present invention to the embodiment(s) shown, but are for explanation and understanding only.

DETAILED DESCRIPTION OF THE DRAWINGS

The present invention provides a phase detector employing asynchronous level-mode sequential circuitry. The present invention can be employed in clock management circuits of integrated circuit (IC) devices to compensate for clock skew, for example. While the present invention is described with specific reference to clock management circuits for synthesizing frequency, those skilled in the art will appreciate that the present invention may be used in any clock management circuit used for various applications within an IC device.

Figure 1:
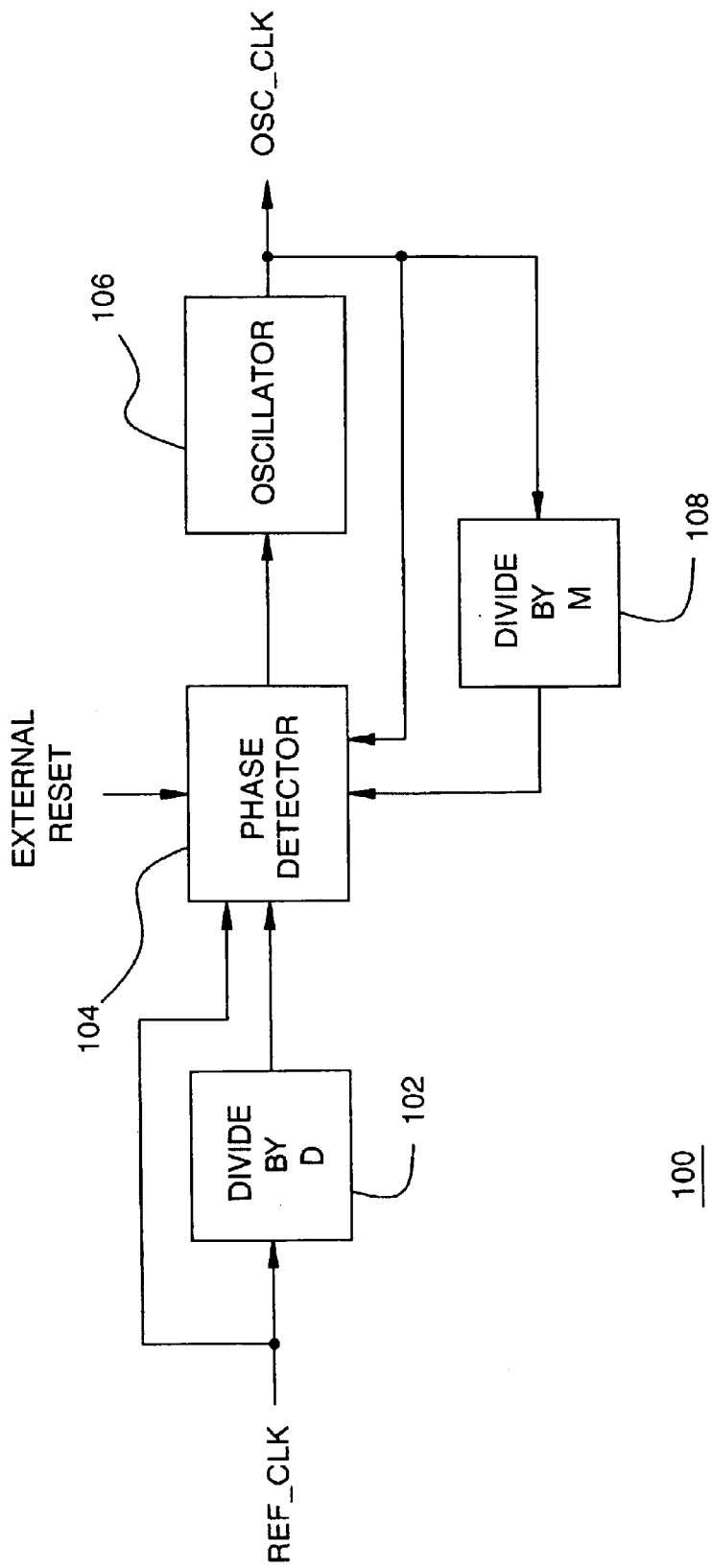
FIG. 1 depicts a block diagram of an exemplary frequency synthesis circuit in which the invention is useful.

FIG. 1 depicts a block diagram of an exemplary frequency synthesis circuit 100 in which the invention is useful. Frequency synthesis circuit 100 includes a frequency divider 102, a phase detector 104, an oscillator 106, and a frequency divider 108. Frequency synthesis circuit 100 is responsive to an input clock signal REF_CLK (also referred to as a reference clock signal), and generates an output clock signal OSC_CLK (also referred to as an oscillator clock signal). In general, frequency synthesis circuit 100 synchronizes clock signal OSC_CLK with clock signal REF_CLK such that clock signal OSC_CLK includes M cycles for each D cycles of clock signal REF_CLK, where M and D are positive integers. That is, the frequency of clock signal OSC_CLK is M/D times the frequency of clock signal REF_CLK, where the phase of clock signal OSC_CLK is synchronized with clock signal REF_CLK at a time referred to herein as "concurrence". Concurrence is the instant in time when the positive edges (or alternatively, the negative edges) of clock signals REF_CLK and OSC_CLK are (or should be) in phase.

More specifically, frequency divider 202 is responsive to clock signal REF_CLK and divides the frequency of clock signal REF_CLK by a selected amount, D. Phase detector 104 is responsive to output of frequency divider 102. Phase detector 104 is also responsive to clock signal REF_CLK. Oscillator 106 generates clock signal OSC_CLK, which is coupled to frequency divider 108. Frequency divider 108 divides the frequency of clock signal OSC_CLK by a selected value, M. Phase detector 104 is also responsive to output of frequency divider 108 and clock signal OSC_CLK. Phase detector 104 compares the phase of clock signal OSC_CLK with the phase of clock signal REF_CLK gated by the output of frequency divider 102 and frequency divider 108. That is, the phase comparison is only performed at the time of concurrence. Phase detector 104 generates an output signal to provide proper direction for adjusting the frequency of oscillator 106. The frequency of oscillator 106 is adjusted such that clock signal OSC_CLK includes M cycles for D cycles of clock signal REF_CLK.

Phase detector 104 is optionally responsive to an external reset signal to restart the comparison between clock signals OSC_CLK and REF_CLK. In addition, phase detector 104 is optionally responsive to gate control signals used to control when phase detector 104 compares the relative phases between clock signals OSC_CLK and REF_CLK. Embodiments of phase detector 104 with and without gate control signals are described below in more detail.

Oscillator 106 may be a voltage controlled oscillator (VCO), a tap-controlled oscillator (TCO), or another well-known oscillator circuit. Oscillator 106 oscillates at a particular frequency guided by phase detector 104 to generate clock signal OSC_CLK. Phase detector 104 incorporates asynchronous level-mode sequential circuitry to correctly detect phase differences between clock signals REF_CLK and OSC_CLK in the presence of jitter. The asynchronous level-mode sequential circuitry results in a phase detector that takes up less area and has better tolerance to mismatch than prior art phase detectors. Moreover, phase detector 104 remains stable between phase detection operations, which is essential for fully-digital clock management systems.

As used herein, asynchronous level-mode sequential circuitry refers to circuitry that is asynchronously responsive to level changes in one or more input signals. That is, an output of asynchronous level-mode sequential circuitry may change state in response to any level-change in an input signal.

Figure 2:
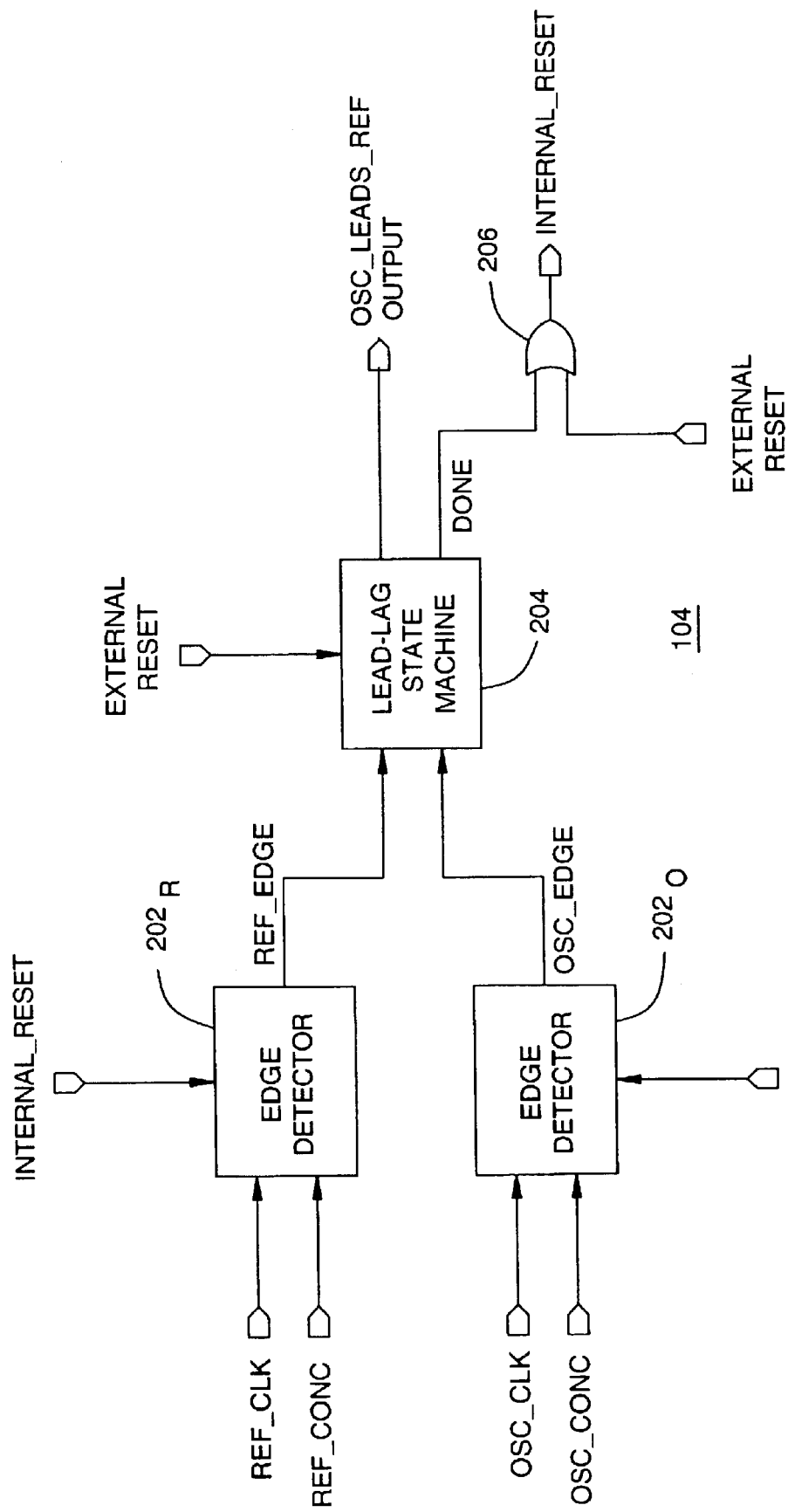
FIG. 2 depicts a block diagram of an exemplary embodiment of a phase detector in accordance with one or more aspects of the invention.

FIG. 2 depicts a block diagram of an exemplary embodiment of phase detector 104 in accordance with one or more aspects of the invention. Phase detector 104 includes edge detectors $202_R$ and $202_O$, (collectively edge detectors 202), and a lead-lag state machine 204. Phase detector 104 is responsive to clock signal REF_CLK, clock signal OSC_CLK, a concurrence signal REF_CONC, and a concurrence signal OSC_CONC. Phase detector 104 generates a control signal OSC_LEADS_REF. When clock signal OSC_CLK is leading clock signal REF_CLK, control signal OSC_LEADS_REF is driven to the active state. Conversely, when clock signal OSC_CLK is lagging clock signal REF_CLK, control signal OSC_LEADS_REF is driven to the inactive state. Control signal OSC_LEADS_REF may be used to guide oscillator 106 to produce clock signal OSC_CLK having a frequency and phase such that clock signals OSC_CLK and REF_CLK are synchronized. Concurrence signals OSC_CONC and REF_CONC act as gate signals to control the timing of phase comparisons between clock signals REF_CLK and OSC_CLK, as described in more detail below.

More specifically, edge detector $202_R$ is responsive to clock signal REF_CLK and concurrence signal REF_CONC. Likewise, edge detector $202_O$ is responsive to clock signal OSC_CLK and concurrence signal OSC_CONC. Edge detector $202_R$ generates an edge detection signal REF_EDGE, and edge detector $202_O$ generates an edge detection signal OSC_EDGE. When concurrence signal REF_EDGE is in an active state, edge detector $202_R$ drives edge detection signal REF_EDGE to the active state when the next edge of clock signal REF_CLK arrives. When concurrence signal OSC_EDGE is in the active state, edge detector $202_O$ drives edge detection signal OSC_EDGE to the active state when the next edge of OSC_CLK arrives. In one embodiment, edge detectors 202 detect positive edges of the clock signals. Alternatively, edge detectors 202 may be configured to detect negative edges of the clock signals.

In one embodiment, edge detectors 202 are asynchronous level-mode sequential circuits. Edge detectors 202 asynchronously detect the next edge of their respective clock signals when their respective concurrence signals are in the active state. Thus, a level-change in a clock signal and/or a concurrence signal will cause a change in state of the edge detection signal and/or one or more internal signals in a given edge detector 202. An embodiment of operation of edge detectors 202 is described in detail below with respect to FIG. 9.

Lead-lag state machine 204 is responsive to edge detection signals REF_EDGE and OSC_EDGE. Lead-lag state machine 204 incorporates asynchronous level-mode sequential circuitry. Responsive to edge detection signals REF_EDGE and OSC_EDGE, lead-lag state machine 204 determines which of clock signals REF_CLK and OSC_CLK is leading. If an edge of clock signal OSC_CLK is detected first, lead-lag state machine 204 drives control signal OSC_LEADS_REF to the active state. If an edge of input signal REF_CLK is detected, lead-lag state machine 204 drives control signal OSC_LEADS_REF to the inactive state.

After each phase comparison, lead-lag state machine 204 drives a reset signal INTERNAL_RESET to an active state. Reset signal INTERNAL_RESET is coupled to edge detectors $202_R$ and $202_O$ in order to reset edge detection signals REF_EDGE and OSC_EDGE, respectively, to an inactive state. In one embodiment, an external reset signal is coupled to lead-lag state machine 204. If the external reset signal is used, reset signal INTERNAL_RESET is coupled to an OR gate 206 along with the external reset signal. If either reset signal INTERNAL_RESET or the external reset signal is in the active state, edge detectors 202 will be reset. Operation of lead-lag state machine 204 is described below in more detail.

Figure 3:
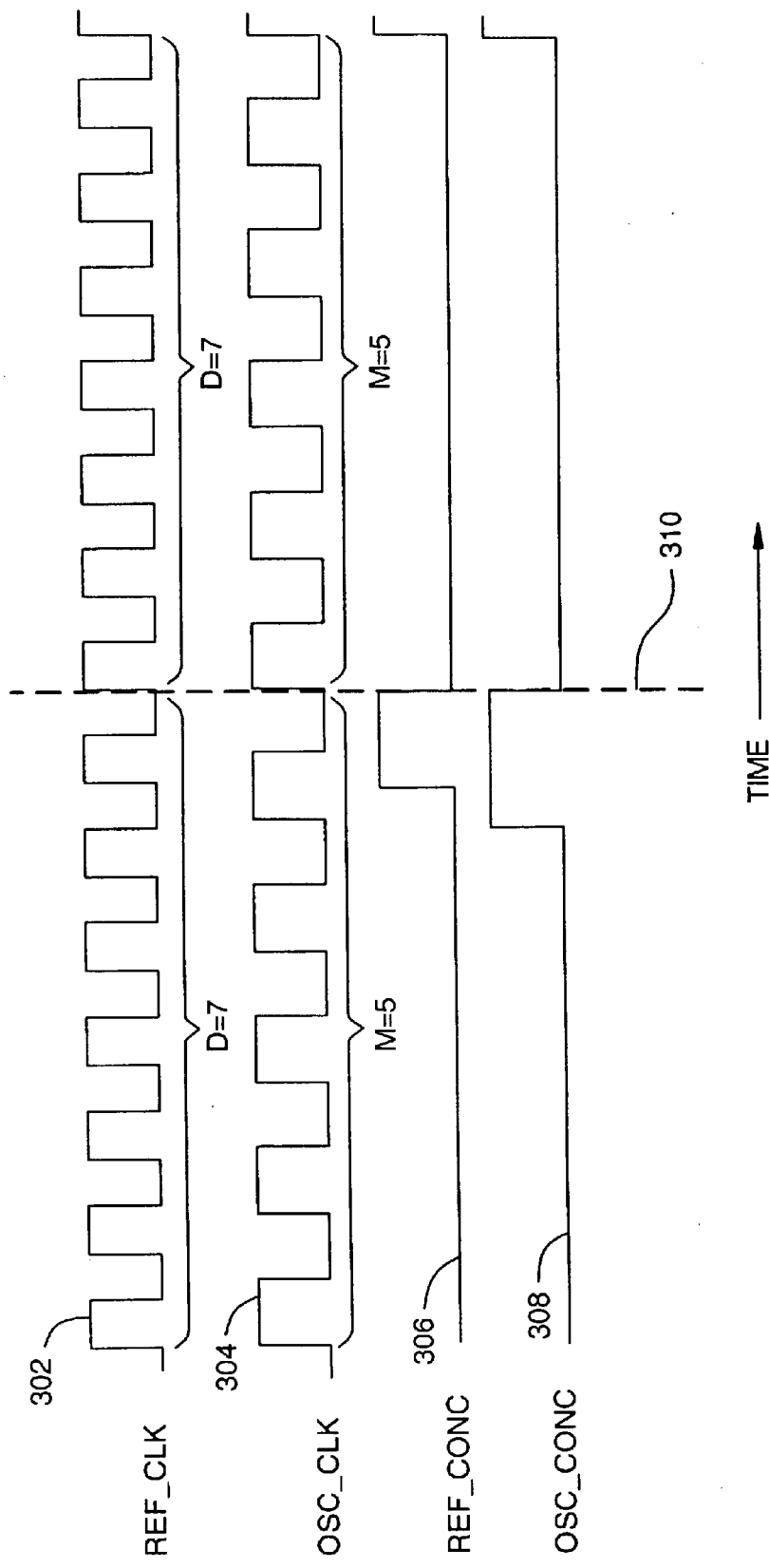
FIG. 3 graphically illustrates exemplary embodiments of input signals to the phase detector of FIG. 2.

FIG. 3 graphically illustrates exemplary embodiments of input signals to phase detector 104. In this example, clock signals OSC_CLK and REF_CLK are synchronized (i.e., phase aligned). Signal 302 illustrates clock signal REF_CLK, signal 304 illustrates clock signal OSC_CLK, signal 306 illustrates concurrence signal REF_CONC, and signal 308 illustrates concurrence signal OSC_CONC, all with increasing time. Vertical line 310 illustrates the instance in time when positive edges of both clock signals REF_CLK and OSC_CLK are (or should be) in phase. The event marked by vertical line 310 is referred to herein as concurrence. Concurrence occurs (or should occur) every D cycles of clock signal REF_CLK, and every M cycles of clock signal OSC_CLK.

Phase detector 104 generates an output signal indicative of a phase difference between clock signals OSC_CLK and REF_CLK at each concurrence. Phase detector 104 guides oscillator 106 such that clock signal OSC_CLK is aligned with clock signal REF_CLK at each concurrence. In this manner, phase alignment between clock signal OSC_CLK and REF_CLK is maintained.

In one embodiment, phase detector 104 only performs a phase comparison at concurrence. Concurrence signal REF_CONC is driven to an active state for the duration of the oscillatory period of input signal REF_CLK immediately before concurrence. Concurrence signal OSC_CONC is driven to an active state for the duration of the oscillatory period of output signal OSC_CLK immediately before concurrence is expected. Concurrence signals REF_CONC and OSC_CONC are used to gate edge detectors 202 as described in detail below.

Figure 4:
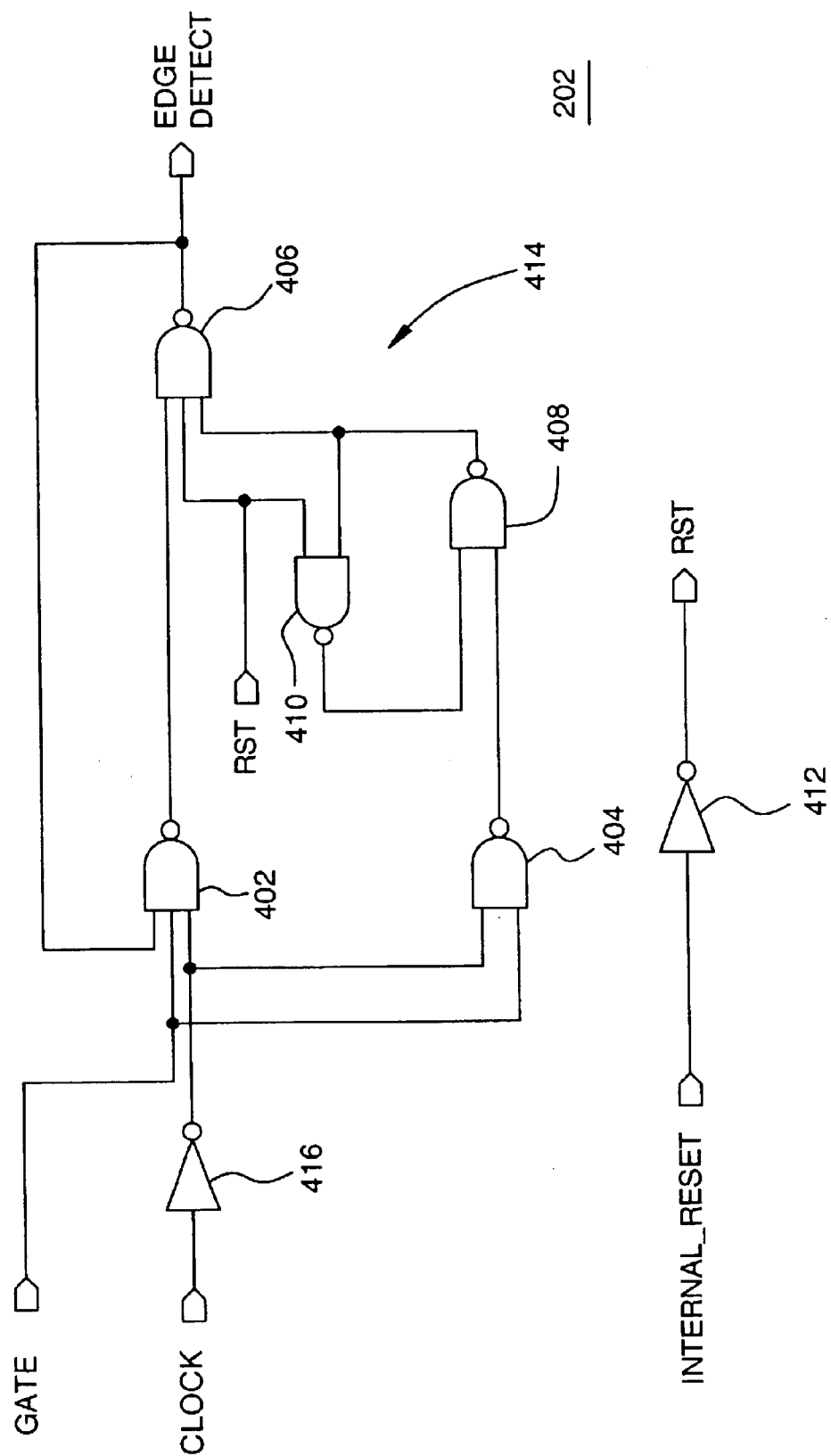
FIG. 4 depicts a schematic diagram showing an exemplary embodiment of an edge detector in accordance with one or more aspects of the invention.

FIG. 4 depicts a schematic diagram showing an exemplary embodiment of edge detector 202 in accordance with one or more aspects of the invention. In one embodiment, edge detector 202 includes NAND gates 402 through 406, loop 414, and inverters 412 and 416. The loop 414 includes NAND gates 408 and 410. Edge detector 202 is responsive to gate, clock, and reset input signals. Edge detector 202 generates an edge detection output signal that indicates whether an edge in the clock input signal has arrived. In the present embodiment, the edge detection signal is an active low signal.

More specifically, the clock and reset signals are inverted by inverters 416 and 412, respectively. NAND gate 402 is responsive to the inverted clock signal, the gate signal, and the edge detection signal. NAND gate 404 is responsive to the inverted clock signal and the gate signal. NAND gate 408 is responsive to output from NAND gate 404 and output from NAND gate 410. NAND gate 410 is responsive to output from NAND gate 408 and the inverted reset signal. NAND gate 406 is responsive to output from NAND gate 402, the reset signal, and output from NAND gate 408.

In operation, the gate signal may be driven by either of concurrence signals OSC_CONC and REF_CONC. The clock signal may be driven by either of clock signals OSC_CLK and REF_CLK. The reset signal may be driven by reset signal INTERNAL_RESET. In an active low embodiment, the edge detection signal is initially in a logic high state and transitions to a logic low state when the gate signal is in the active state (logic high) and an edge of the clock signal arrives. When the gate signal is in the inactive state (logic low), the edge detection signal does not change in response to the clock signal. The intrinsic delay of loop 414 controls the minimum acceptable pulse width of the clock signal. Although edge detector 202 has been described as having NAND logic gates, those skilled in the art will appreciate that other combinations of logic gates can be used, such as AND gates.

Figure 5A:
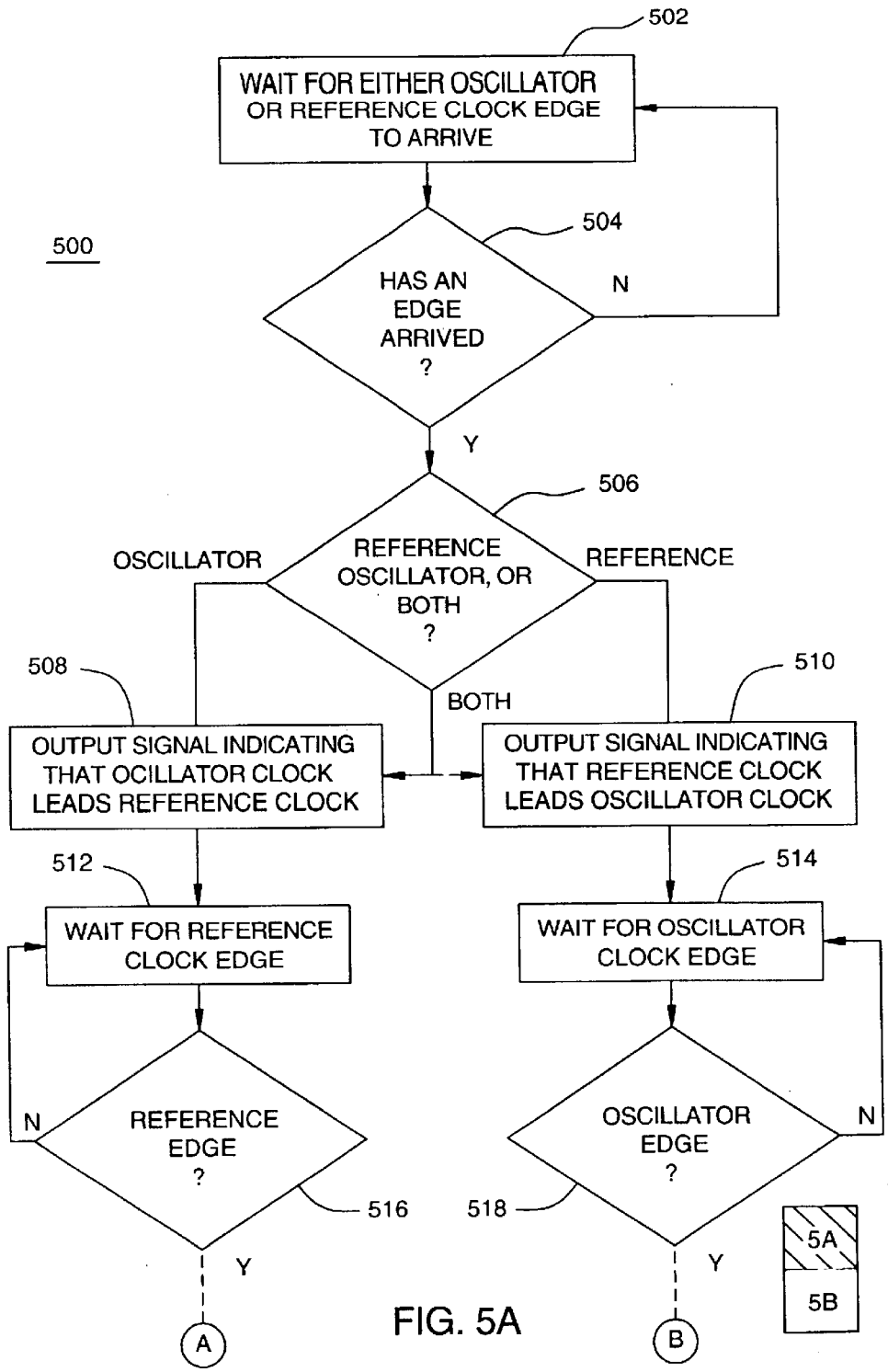
FIG. 5 (comprising FIGS. 5A and 5B) depicts a flow diagram showing an exemplary embodiment of a process for detecting phase differences between two clock signals in accordance with one or more aspects of the invention.

FIG. 5 depicts a flow diagram showing an exemplary embodiment of a process 500 for detecting phase differences between two clock signals in accordance with one or more aspects of the invention. The process 500 may be executed by lead-lag state machine 204 in order to detect phase differences between clock signals OSC_CLK and REF_CLK. An embodiment of process 500 is described in this context. Specifically, at step 502, process 500 begins by waiting for detection of an edge in either or both of clock signals OSC_CLK and REF_CLK. At step 504, a determination is made as to whether any edge has been detected. If not, process 500 returns to step 502. If an edge is detected in either of clock signals OSC_CLK and REF_CLK, process 500 proceeds to step 506.

At step 506, a determination is made as to which of clock signals OSC_CLK and REF_CLK has a leading edge. If an edge has been detected in clock signal OSC_CLK, process proceeds to step 508. If an edge has been detected in clock signal REF_CLK, process proceeds to step 510. If edges have been simultaneously detected in both of clock signals REF_CLK and OSC_CLK, process 500 may proceed to step 516. Alternatively, if edges have been simultaneously detected in both of clock signals REF_CLK and OSC_CLK, process 500 may proceed to step 518.

At step 508, an output signal is generated indicating that clock signal OSC_CLK is leading clock signal REF_CLK. At step 512, process 500 waits for a detected edge of clock signal REF_CLK. At step 516, a determination is made as to whether an edge of clock signal REF_CLK has been detected. If an edge is detected, process 500 proceeds to step 520. Otherwise, process 500 returns to step 512. At step 520, an internal reset signal is asserted.

At step 518, an output signal is generated indicating that clock signal REF_CLK is leading output signal OSC_CLK. At step 514, process 500 waits for a detected edge of clock signal OSC_CLK. At step 518, a determination is made as to whether an edge of clock signal OSC_CLK has been detected. If an edge is detected, process 500 proceeds to step 522. Otherwise, process 500 returns to step 514. At step 522, an internal reset signal is asserted.

At step 524, process 500 waits for both the detector of the edge in clock signal OSC_CLK and the detector of the edge in clock signal REF_CLK to reset. At step 526, a determination is made as to whether both detectors have been reset. If so, process 500 proceeds to step 502. Otherwise, process 500 returns to step 524.

Figure 6:
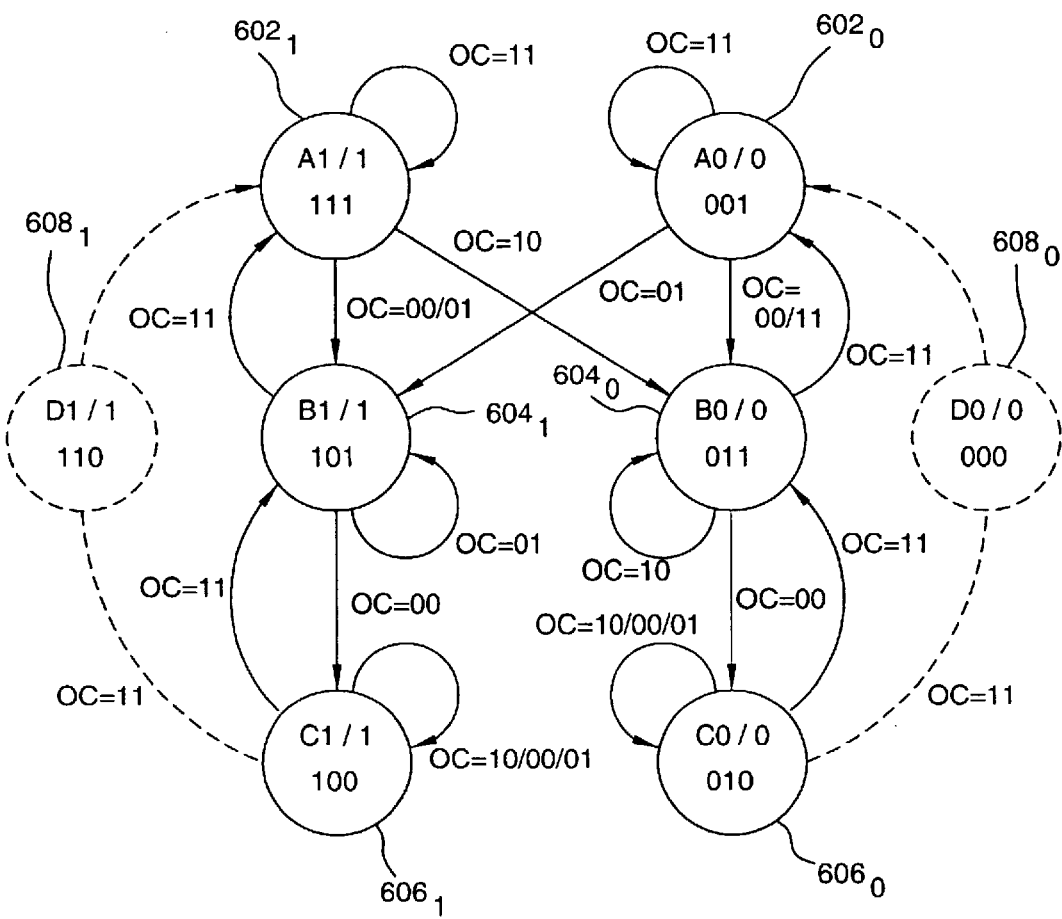
FIG. 6 depicts a state diagram showing an exemplary embodiment of operation of a lead-lag state machine in accordance with one or more aspects of the invention.
Figure 6:
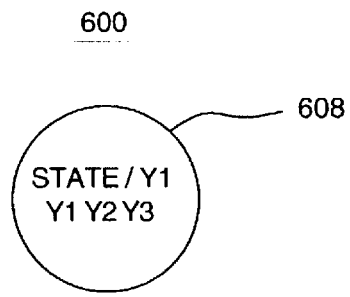

FIG. 6 depicts a state diagram showing an exemplary embodiment of operation of lead-lag state machine 204 in accordance with one or more aspects of the invention. In an embodiment, lead-lag state machine 204 is a Moore asynchronous level-mode state machine including initial states $602_0$ and $602_1$ (states A0 and A1, respectively), intermediate states $604_0$ and $604_1$ (states B0 and B1, respectively), and end states $606_0$ and $606_1$ (states C0 and C1, respectively). As is well known in the art, a Moore state machine provides outputs that depend only on the current state of the state machine, in contrast to a Mealy state machine in which the outputs depend on the inputs in addition to the current state of the state machine. The nomenclature used in FIG. 6 is shown in legend 608. Lead-lag state machine 204 is responsive to edge detection signal OSC_EDGE (referred to in FIG. 6 as signal O) and edge detection signal REF_EDGE (referred to in FIG. 6 as signal C). In this embodiment, edge detection signals O and C are active low signals. Lead-lag state machine 204 generates output signals Y1, Y2, and Y3, at each of states 602, 604, and 606. When clock signal OSC_CLK leads clock signal REF_CLK, output signal Y1 is active high. When clock signal OSC_CLK lags clock signal REF_CLK, output signal Y1 is inactive low.

More specifically, state A0 is the initial state of lead-lag state machine 204 in a case where clock signal OSC_CLK previously lagged clock signal REF_CLK. State A1 is the initial state of lead-lag state machine 204 in a case where clock signal OSC_CLK previously led clock signal REF_CLK. Operation of lead-lag state machine 204 is now described starting from initial state A0.

If edge detection signals O and C are each high (OC=11), then lead-lag state machine 204 remains in state A0 and generates an output Y1, Y2, Y3 of 001. In state A0, no edges have been detected. When OC=01 (i.e., an edge is detected in clock signal OSC_CLK), lead-lag state machine 204 transitions to state B1 and generates an output of 101. Output signal Y1 changes state, since clock signal OSC_CLK now leads clock signal REF_CLK. If OC=00 (i.e., both edges have been detected at the same time) or OC=10 (i.e., an edge is detected in clock signal REF_CLK), lead-lag state machine 204 transitions to state Y0 and generates an output of 011. Output signal Y1 remains in the same state, since clock signal OSC_CLK still lags clock signal REF_CLK. Alternatively, if an edge is detected in both clock signals OSC_CLK and REF_CLK (OC=00), the lead-lag state machine 204 may transition to state B1 instead of state B0.

Lead-lag state machine 204 remains in state B0 until an edge is detected in clock signal OSC_CLK. That is, as long as OC=10, lead-lag state machine 204 remains in state B0. When OC=00, lead-lag state machine 204 transitions to state C0 and generates an output of 010. Output signal Y1 does not change state since clock signal OSC_CLK still lags clock signal REF_CLK. At state C0, lead-lag state machine 204 changes the state of reset signal INTERNAL_RESET in order to reset the edge detectors 202. When edge detectors 202 are reset, OC=11 and lead-lag state machine 204 will transition from state C0, to state B0, and then to state A0. In another embodiment, lead-lag state machine 204 transitions to a transition state $608_0$ (state D0) and then to state A0. Operation of lead-lag state machine 204 when starting from initial state A1 is symmetrical with respect to operation, starting from initial state A0. Accordingly, lead-lag state machine 204 may include a transition state $608_1$ (state D1).

Figure 7:
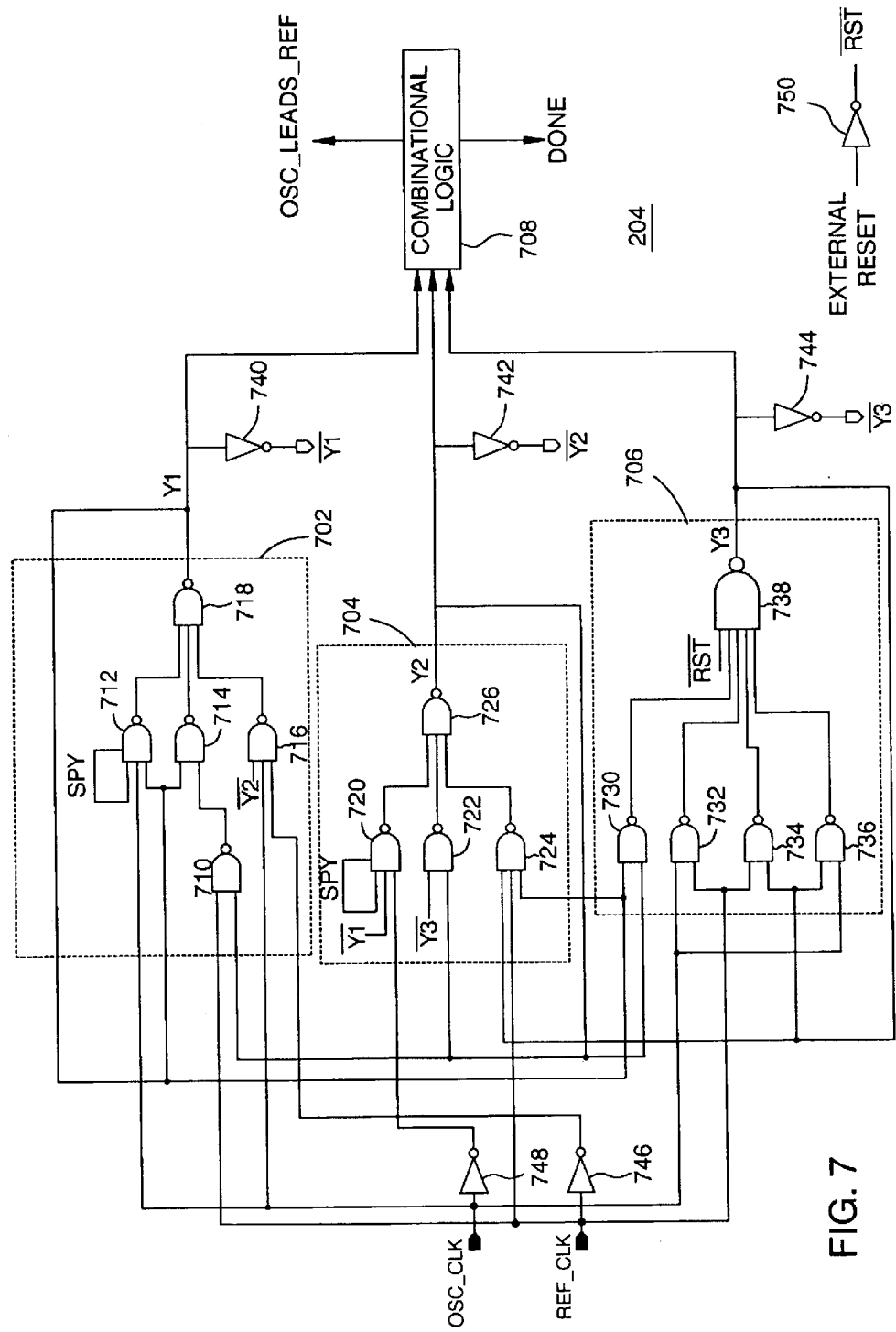
FIG. 7 depicts a schematic diagram showing an exemplary embodiment of a lead-lag state machine in accordance with one or more aspects of the invention.

FIG. 7 depicts a schematic diagram showing an exemplary embodiment of lead-lag state machine 204 in accordance with one or more aspects of the invention. Lead-lag state machine 204 comprises circuits 702, 704, and 706, as well as combinatorial logic 708. Circuit 702 generates output signal Y1; circuit 704 generates output signal Y2; and circuit 706 generates output signal Y3. Output signals Y1, Y2, and Y3 are coupled to combinatorial logic 708. Combinatorial logic 708 generates a signal DONE and control signal OSC_LEADS_REF based on the logical values of Y1, Y2, and Y3 as described above in detail. Inverters 740, 742, and 744 invert output signals Y1, Y2, and Y3, respectively. Inverters 746 and 748 invert clock signals REF_CLK and OSC_LCK, respectively. Inverter 750 inverts the external reset signal to produce reset signal RST.

More specifically, circuit 702 includes NAND gates 710 through 718. NAND gate 710 is responsive to clock signal REF_CLK and output signal Y2. NAND gate 712 is responsive to a logic one signal from a supply source SUPPLY, clock signal OSC_CLK, and output signal Y1. NAND gate 714 is responsive to output signal Y1 and the output from NAND gate 710. NAND gate 716 is responsive to clock signal OSC_CLK, inverted clock signal REF_CLK, and inverted output signal Y2. NAND gate 718 is responsive to output from NAND gates 712, 714, and 716. NAND gate 718 generates output signal Y1.

Circuit 704 includes NAND gates 720 through 726. NAND gate 720 is responsive to the supply signal, inverted output signal Y1, and inverted clock signal OSC_CLK. NAND gate 722 is responsive to output signal Y2 and inverted output signal Y3. NAND gate 724 is responsive to output signal Y3, clock signal REF_CLK, and output signal Y1. NAND gate 726 is responsive to output from NAND gates 720, 722, and 724. NAND gate 726 generates output signal Y2.

Circuit 706 includes NAND gates 730 through 738. NAND gate 730 is responsive to output signals Y1 and Y2. NAND gate 732 is responsive to clock signals OSC_CLK and REF_CLK. NAND gate 734 is responsive to clock signal REF_CLK and output signal Y3. NAND gate 736 is responsive to output signal Y3 and clock signal OSC_CLK. NAND gate 738 is responsive to output from NAND gates 730, 732, 734, and 736, as well as active low reset signal RST. NAND gate 738 generates output signal Y3.

Thus the circuit of FIG. 7 implements the state machine of FIG. 6. Other circuits can alternatively implement the state machine of FIG. 6, as would be understood by one of ordinary skill in the art.

Figure 8:
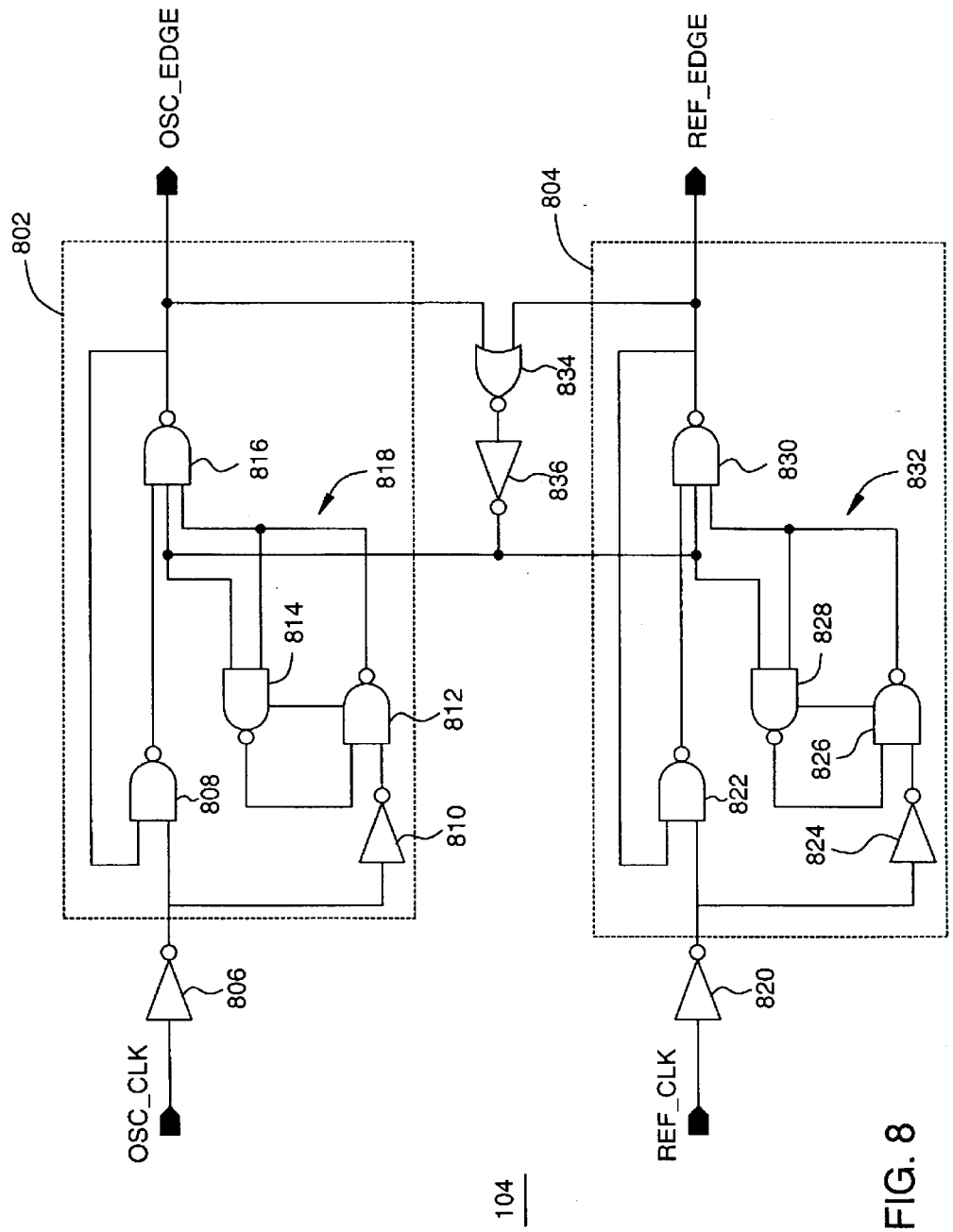
FIG. 8 depicts a schematic diagram showing another exemplary embodiment of a phase detector in accordance with one or more aspects of the invention.

FIG. 8 depicts a schematic diagram showing another exemplary embodiment of phase detector 104 in accordance with one or more aspects of the invention. Phase detector 104 includes an edge detector 802 coupled to an inverter 806, and an edge detector 804 coupled to an inverter 820. Edge detector 802 is responsive to the inverted version of clock signal OSC_CLK, and edge detector 804 is responsive to the inverted version of clock signal REF_CLK. Edge detector 802 generates edge detection signal OSC_EDGE, and edge detector 804 generates edge detection signal REF_EDGE. Edge detectors 802 and 804 operate substantially as described above with respect to FIG. 4, except that no gate signal is present to gate detection of an edge. Edge detectors 802 and 804 are asynchronous level-mode sequential circuits that are asynchronously responsive to level changes in clock signals OSC_CLK and REF_CLK, respectively.

More specifically, edge detector 802 includes an inverter 810, and NAND gates 808, 812, 814, and 816. NAND gates 812 and 814 form a loop 818. Edge detector 804 similarly includes an inverter 824, and NAND gates 822, 826, 828, and 830. NAND gates 826 and 828 form a loop 832. As described above, the intrinsic delay of loops 818 and 832 control the minimum acceptable pulse width of clock signals OSC_CLK and REF_CLK, respectively.

In an active low embodiment, edge detection signals OSC_EDGE and REF_EDGE are initially in a logic high state and transition to a logic low state when edges of clock signals OSC_CLK and REF_CLK, respectively, arrive. When both edge detection signals OSC_EDGE and REF_EDGE are in a logic low state, a reset signal is generated by NOR gate 834 and inverter 836 to reset each of edge detectors 802 and 804. Although edge detectors 802 and 804 have been described as having NAND logic gates, those skilled in the art will appreciate that other combinations of logic gates can be used, such as AND gates.

Embodiments of phase detector 104 shown in FIGS. 2 and 8 include edge detectors that take up less area, generate less noise, exhibit better mismatch tolerance for deep sub-micron processes, and exhibit a smaller cross-over distortion than prior art phase detectors that employ flip-flop edge detectors. Cross-over distortion is attributed to internal gate and wire delays of the critical path of the edge detector. In general, the critical path of a circuit is defined as the path from primary inputs to primary outputs exhibiting the longest delay. For example, the critical path of edge detector 802 when OSC_CLK transitions from 0 to 1 is through NAND gates 808 and 816. Likewise, the critical path of edge detector 804 when REF_CLK transitions from 0 to 1 is through NAND gates 822 and 830. Edge detectors 202, 802 and 804 exhibit smaller cross-over distortion than prior art flip-flop edge detectors, since the critical path within each of edge detectors 202, 802, and 804 includes only two levels of gating (i.e., NAND gates 402 and 406, NAND gates 808 and 816, and NAND gates 822 and 830, respectively).

Figure 9:
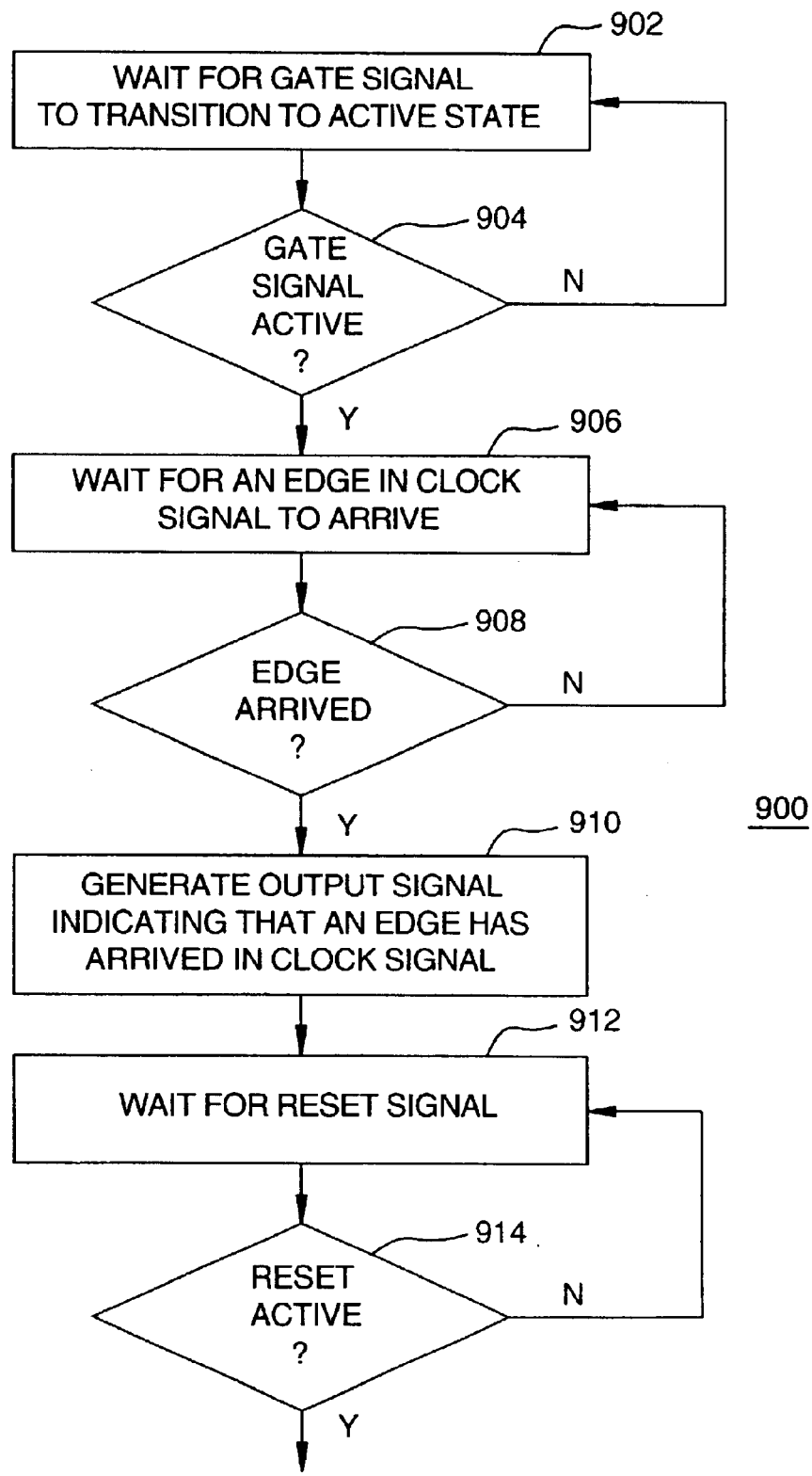
FIG. 9 depicts a flow diagram showing an exemplary embodiment of a process for detecting an edge in a clock signal in accordance with one or more aspects of the invention.

FIG. 9 depicts a flow diagram showing an exemplary embodiment of a process 900 for detecting an edge in a clock signal in accordance with one or more aspects of the invention. Process 900 may be performed by edge detectors 202 shown in FIG. 2, as well as by edge detectors 802 and 804 shown in FIG. 8. At step 902, process 900 begins by waiting for a gate signal to transition to an active state. At step 904, a determination is made as to whether the gate signal has transitioned to an active state. If so, process 900 proceeds to step 906. Otherwise, process 900 returns to step 902. Alternatively, process 900 may begin at step 906 if no gate signal is used (e.g., edge detectors 802 and 804 of FIG. 8).

At step 906, process 900 waits for an edge of a clock signal to arrive,. At step 908, a determination is made as to whether a edge of the clock signal has arrived. If so, process 900 proceeds to step 910. Otherwise, process 900 returns to step 906. At step 910, an output signal is generated indicating that an edge has arrived in the clock signal. As described above, the detected edge may be a positive edge. Alternatively, the detected edge may be a negative edge. At step 912, process 900 waits for a reset signal to transition to an active state. At step 914, a determination is made as to whether the reset signal has transitioned to an active state. If so, process 900 returns to step 902. Otherwise, process 900 returns to step 912.

While the foregoing describes exemplary embodiment(s) in accordance with one or more aspects, of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps.

What is claimed is:

1. A phase detector, comprising:
    a first edge detector configured to receive a first clock signal and to provide a first edge signal responsive to a detected edge of the first clock signal;
    a second edge detector configured to receive a second clock signal and to provide a second edge signal responsive to a detected edge of the second clock signal; and
    a state machine coupled to receive the first edge signal and the second edge signal, the state machine configured to respond to level changes in the first edge signal and the second edge signal with asynchronous generation of a control signal to indicate which of the first clock signal and the second clock signal leads.

2. The phase detector of claim 1, wherein the first edge detector is configured to receive a first concurrence signal, wherein the second edge detector is configured to receive a second concurrence signal, wherein the phase detector is configured to generate the first concurrence signal and the second concurrence signal responsive to the first clock signal and the second clock signal being in phase, wherein the first edge detector is configured to control detection of the detected edge of the first clock signal responsive to the first concurrence signal, and wherein the second edge detector is configured to control detection of the detected edge of the second clock signal responsive to the second concurrence signal.

3. The phase detector of claim 1, wherein each of the first edge detector and the second edge detector is an asynchronous level-mode sequential circuit.

4. The phase detector of claim 2, wherein the first edge detector comprises:
    an inverter having an input for receiving the first clock signal;
    a first logic gate having inputs for receiving the first concurrence signal, an output of the inverter, and the first edge signal, the first edge signal being fed back to the first logic gate;
    a second logic gate having inputs for receiving the first concurrence signal and the output of the inverter;
    a loop circuit having inputs for receiving an output of the second logic gate and a reset signal, the loop circuit providing delay for controlling a pulse width of the first clock signal; and
    a third logic gate having inputs for receiving an output of the first logic gate, an output of the loop circuit, and the reset signal, the third logic gate configured to generate the first edge signal.

5. The phase detector of claim 4, wherein the loop circuit comprises:
    a fourth logic gate having inputs for receiving the output of the second logic gate and an output of a fifth logic gate;
    the fifth logic gate having inputs for receiving the reset signal and an output of the fourth logic gate.

6. The phase detector of claim 1, wherein the state machine is an asynchronous level-mode state machine.

7. The phase detector of claim 6, wherein the state machine is a Moore state machine.

8. A method of phase detection, comprising:
    providing a first clock signal to a first edge detector;
    providing a second clock signal to a second edge detector;
    generating a first edge signal indicating detection of an edge in the first clock signal with the first edge detector;
    generating a second edge signal indicating detection of an edge in the second clock signal with the second edge detector;
    generating a first concurrence signal and a second concurrence signal responsive to phase alignment of the first clock signal and the second clock signal;
    responsive to level changes in the first concurrence signal and the second concurrence signal, allowing edge detection in the first clock signal and the second clock signal; and
    responsive to level changes in the first edge signal and the second edge signal, asynchronously generating a control signal indicating which of the first clock signal and the second clock signal leads.

9. The method of claim 8, wherein the step of asynchronously generating the control signal comprises:
    determining whether an edge has been detected in at least one of the first clock signal and the second clock signal; and
    generating the control signal responsive to the edge detected.

10. A phase detector, comprising:
    a first edge detector having an input for receiving a first clock signal, the first edge detector configured to asynchronously respond to both high and low level-changes in the first clock signal and generate a first edge signal indicating detection of an edge in the first clock signal;
    a second edge detector having an input for receiving a second clock signal, the second edge detector configured to asynchronously respond to both high and low level-changes in the second clock signal and generate a second edge signal indicating detection of an edge in the second clock signal; and
    a state machine coupled to receive the first edge signal and the second edge signal, the state machine configured to respond to level chances in the first edge signal and the second edge signal with generation of a control signal to indicate which of the first clock signal and the second clock signal leads.

11. The phase detector of claim 10, wherein each of the first edge detector and the second edge detector includes a critical path having only two gates.

12. The phase detector of claim 10, wherein each of the first edge detector and the second edge detector comprise:
    a first inverter having an input for receiving a clock signal;

a first logic gate having inputs for receiving an output of the first inverter and an edge signal;

a second inverter having an input for receiving the clock signal;

a loop circuit having inputs for receiving an output of the second inverter and a reset signal, the loop circuit providing delay for controlling a minimum acceptable pulse width of the first clock signal; and a second logic gate having inputs for receiving an output of the first logic gate, an output of the loop circuit, and the reset signal, the second logic gate configured to generate the edge signal.

13. The phase detector of claim 10, wherein the loop circuit comprises:

a third logic gate having inputs for receiving the output of the second inverter and an output of a fourth logic gate; and the fourth logic gate having inputs for receiving the reset signal and an output of the third logic gate.

14. The phase detector of claim 10, further comprising:

a reset circuit having inputs for receiving the first edge signal and the second edge signal, the reset circuit configured to reset the first edge detector and the second edge detector when respective edges have been detected in each of the first clock signal and the second clock signal.

15. The phase detector of claim 14, wherein the reset circuit comprises:

a logic gate having inputs for receiving the first edge signal and the second edge signal; and an inverter having an input for receiving an output of the logic gate.

* * * * *